(12) United States Patent
Akram et al.

(10) Patent No.: US 7,129,725 B2
(45) Date of Patent: Oct. 31, 2006

(54) SEMICONDUCTOR TEST INTERCONNECT WITH VARIABLE FLEXURE CONTACTS HAVING POLYMER MATERIAL

(75) Inventors: Salman Akram, Boise, ID (US); Alan G. Wood, Boise, ID (US)

(73) Assignee: Micron Technology, Inc., Boise, ID (US)

(*) Notice: Subject to any disclaimer, the term of this patent is extended or adjusted under 35 U.S.C. 154(b) by 0 days.

(21) Appl. No.: 11/208,995

(22) Filed: Aug. 22, 2005

(65) Prior Publication Data

US 2006/0001439 A1 Jan. 5, 2006

Related U.S. Application Data

(60) Division of application No. 10/329,212, filed on Dec. 24, 2002, now Pat. No. 6,982,564, which is a continuation of application No. 09/729,114, filed on Dec. 4, 2000, now Pat. No. 6,498,503, which is a division of application No. 09/340,879, filed on Jun. 28, 1999, now Pat. No. 6,310,484, which is a continuation-in-part of application No. 08/972,088, filed on Nov. 17, 1997, now Pat. No. 6,072,321, which is a division of application No. 08/625,281, filed on Apr. 1, 1996, now Pat. No. 5,869,974.

(51) Int. Cl.
*G01R 31/02* (2006.01)

(52) U.S. Cl. .................................... 324/754
(58) Field of Classification Search ............... None
See application file for complete search history.

(56) References Cited

U.S. PATENT DOCUMENTS

| | | | |
|---|---|---|---|
| 4,795,977 A | 1/1989 | Frost et al. | |
| 5,046,239 A | 9/1991 | Miller et al. | |
| 5,172,050 A | * 12/1992 | Swapp | ................. 324/762 |
| 5,225,037 A | 7/1993 | Elder et al. | |
| 5,289,631 A | 3/1994 | Koopman et al. | |
| 5,341,564 A | 8/1994 | Akhavain et al. | |
| 5,495,667 A | 3/1996 | Farnworth et al. | |
| 5,500,605 A | 3/1996 | Chang | |
| 5,519,332 A | 5/1996 | Wood et al. | |

(Continued)

OTHER PUBLICATIONS

U.S. Appl. No. 09/266,237, Farnworth et al., filed Mar. 10, 1999.

*Primary Examiner*—Jermele Hollington
*Assistant Examiner*—Trung Q. Nguyen
(74) *Attorney, Agent, or Firm*—Stephen A. Gratton

(57) ABSTRACT

An interconnect for testing semiconductor components includes a substrate, and interconnect contacts on the substrate for electrically engaging terminal contacts on the components. The interconnect also includes one or more cavities in the substrate which form flexible segments proximate to the interconnect contacts. The flexible segments permit the interconnect contacts to move independently in the z-direction to accommodate variations in the height and planarity of the terminal contacts. In addition, the cavities can be pressurized, or alternately filled with a polymer material, to adjust a compliancy of the flexible segments. Different embodiments of the interconnect contacts include: metallized recesses for retaining the terminal contacts, metallized projections for penetrating the terminal contacts, metallized recesses with penetrating projections, and leads contained on a polymer tape and cantilevered over metallized recesses. The interconnect can be used to construct a wafer level test system for testing wafer sized components, such as wafers and boards, or to construct a die level test system for testing die sized components, such as unpackaged dice and chip scale packages.

12 Claims, 9 Drawing Sheets

U.S. PATENT DOCUMENTS

| | | |
|---|---|---|
| 5,592,736 A | 1/1997 | Akram et al. |
| 5,625,298 A | 4/1997 | Hirano et al. |
| 5,629,837 A | 5/1997 | Barabi et al. |
| 5,691,041 A | 11/1997 | Frankeny et al. |
| 5,716,218 A | 2/1998 | Farnworth et al. |
| 5,796,264 A | 8/1998 | Farnworth et al. |
| 5,815,000 A | 9/1998 | Farnworth et al. |
| 5,834,945 A | 11/1998 | Akram et al. |
| 5,869,974 A | 2/1999 | Akram et al. |
| 5,894,161 A | 4/1999 | Akram et al. |
| 5,915,977 A | 6/1999 | Hembree et al. |
| 5,931,685 A | 8/1999 | Hembree et al. |
| 5,952,840 A | 9/1999 | Farnworth et al. |
| 5,982,185 A | 11/1999 | Farnworth |
| 6,005,288 A | 12/1999 | Farnworth et al. |
| 6,016,060 A | 1/2000 | Akram et al. |
| 6,018,249 A | 1/2000 | Akram et al. |
| 6,025,730 A | 2/2000 | Akram et al. |
| 6,025,731 A | 2/2000 | Hembree et al. |
| 6,040,239 A | 3/2000 | Akram et al. |
| 6,040,702 A | 3/2000 | Hembree et al. |
| 6,046,598 A | 4/2000 | Miyaji et al. |
| 6,060,891 A | 5/2000 | Hembree et al. |
| 6,068,669 A | 5/2000 | Farnworth et al. |
| 6,072,321 A | 6/2000 | Akram et al. |
| 6,072,326 A | 6/2000 | Akram et al. |
| 6,078,186 A | 6/2000 | Hembree et al. |
| 6,091,252 A | 7/2000 | Akram et al. |
| 6,114,864 A | 9/2000 | Soejima et al. |
| 6,127,736 A | 10/2000 | Akram |
| 6,188,230 B1 | 2/2001 | Birk |
| 6,222,280 B1 | 4/2001 | Farnworth et al. |
| 6,265,245 B1 | 7/2001 | Farnworth et al. |
| 6,275,052 B1 | 8/2001 | Hembree et al. |
| 6,285,203 B1 | 9/2001 | Akram et al. |
| 6,294,837 B1 | 9/2001 | Akram et al. |
| 6,300,782 B1 | 10/2001 | Hembree et al. |
| 6,310,484 B1 | 10/2001 | Akram et al. |
| 6,362,637 B1 | 3/2002 | Farnworth et al. |
| 6,407,570 B1 | 6/2002 | Farnworth et al. |
| 6,414,506 B1 | 7/2002 | Akram et al. |
| 6,437,451 B1 | 8/2002 | Farnworth et al. |
| 6,437,591 B1 | 8/2002 | Farnworth et al. |
| 6,498,503 B1 | 12/2002 | Akram et al. |
| 6,708,399 B1 | 3/2004 | Farnworth et al. |
| 6,798,224 B1 | 9/2004 | Hembree et al. |
| 6,982,564 B1 * | 1/2006 | Akram et al. ............... 324/754 |
| 6,995,577 B1 | 2/2006 | Farnworth et al. |

* cited by examiner

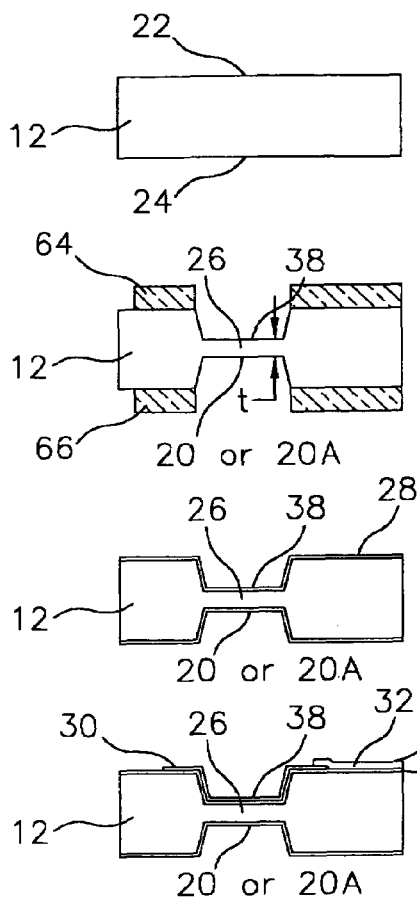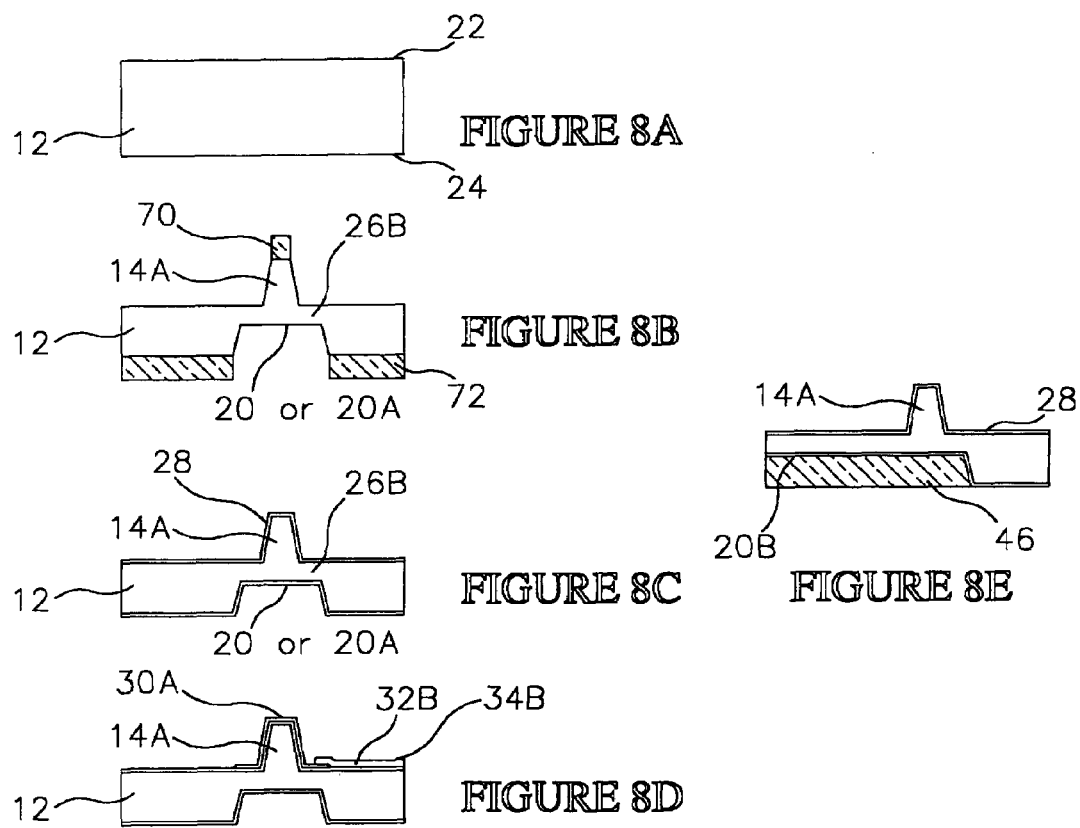

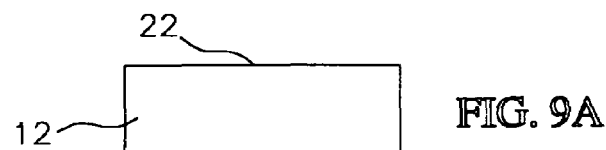
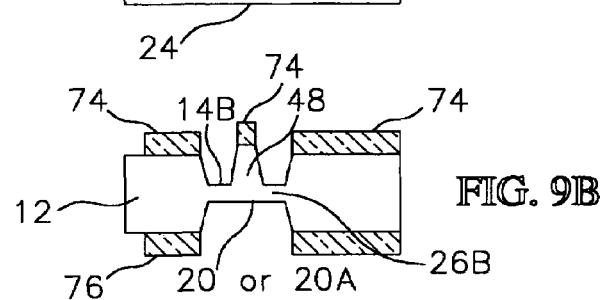
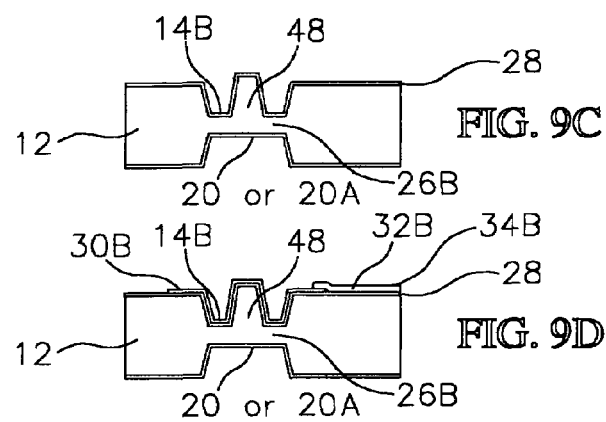
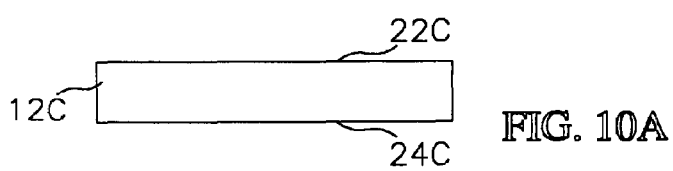
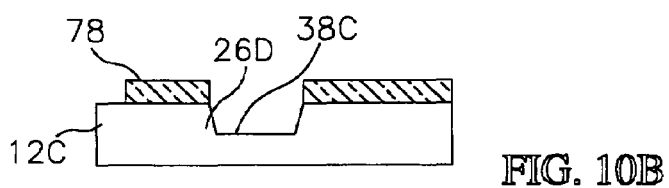
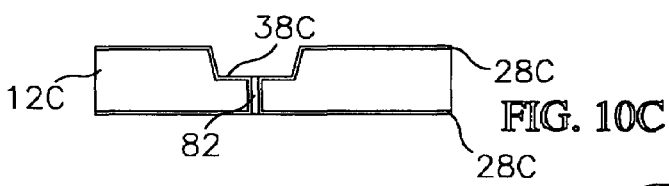
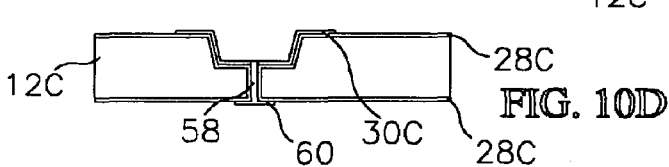
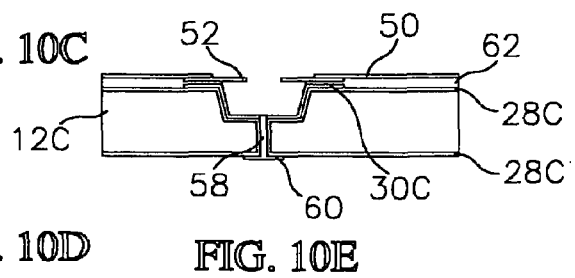

SEMICONDUCTOR TEST INTERCONNECT WITH VARIABLE FLEXURE CONTACTS HAVING POLYMER MATERIAL

CROSS REFERENCE TO RELATED APPLICATIONS

This application is a division of Ser. No. 10/329,212, filed on Dec. 24, 2002, U.S. Pat. No. 6,982,564 B2, which is a continuation of Ser. No. 09/729,114, filed on Dec. 4, 2000, U.S. Pat. No. 6,498,503, which is a division of Ser. No. 09/340,879, filed on Jun. 28, 1999, U.S. Pat. No. 6,310,484 B1, which is a continuation-in-part of Ser. No. 08/972,088, filed on Nov. 17, 1997, U.S. Pat. No. 6,072,321, which is a division of Ser. No. 08/625,281, filed on Apr. 1, 1996, U.S. Pat. No. 5,869,974.

FIELD OF THE INVENTION

This invention relates generally to semiconductor testing, and specifically to an improved interconnect for electrically testing semiconductor components such as dice, packages, wafers, panels, boards, and electronic assemblies containing dice or packages.

BACKGROUND OF THE INVENTION

Semiconductor components, such as bare dice, chip scale packages, BGA devices and wafers can include terminal contacts in the form of bumped contacts. This type of component is sometimes referred to as a "bumped" component (e.g., bumped die, bumped wafer). The bumped contacts provide a high input/output capability for a component, and permit the component to be surface mounted, or alternately flip chip mounted, to a mating substrate, such as a printed circuit board (PCB). Typically, the bumped contacts comprise solder bumps or balls, which permit the components to be bonded to the mating substrate using a solder reflow process. For some components, such as chip scale packages and BGA devices, the bumped contacts can be arranged in a dense array, such as a ball grid array (BGA), or a fine ball grid array (FBGA).

Rather than bumped contacts, semiconductor components can also include terminal contacts in the form of pin contacts, or spring contacts. For example, U.S. Pat. No. 5,496,667 to Farnworth et al. discloses pin contacts, and spring contacts, on unpackaged semiconductor dice.

For performing test procedures on semiconductor components temporary electrical connections must be made with the terminal contacts. Different types of interconnects have been developed for making these temporary electrical connections. For example, a wafer probe card is one type of interconnect that is used to test semiconductor wafers. Another type of interconnect, is contained within a carrier for temporarily packaging singulated components, such as bare dice and chip scale packages, for test and burn-in. In either case, the interconnects include interconnect contacts that make the temporary electrical connections with the terminal contacts on the components.

One problem with making these temporary electrical connections is that variations can occur in the planarity, size, and location of the terminal contacts on the components. For example, the planarity of bumped contacts can vary due to variations in height and diameter of the bumps. Similarly, pin contacts or spring contacts can have different heights and diameters. These variations can occur between the terminal contacts on the same component, and between the terminal contacts on different components. It is advantageous for an interconnect to be able to accommodate these variations, particularly variations in the height and planarity of the terminal contacts. This problem is compounded because the interconnect contacts must penetrate native oxide layers on the terminal contacts to make low resistance electrical connections.

The present invention is directed to an interconnect for making temporary electrical connections with semiconductor components having terminal contacts in the form of bumps, pins or springs.

SUMMARY OF THE INVENTION

In accordance with the present invention, an improved interconnect for testing semiconductor components is provided. Also provided, are a test system incorporating the interconnect, a method for fabricating the interconnect, and a testing method employing the interconnect.

The interconnect includes a substrate, and a plurality of interconnect contacts on the substrate configured to electrically engage terminal contacts on the components, such as bumped contacts, pin contacts or spring contacts. Several different embodiments of the interconnect contacts are provided including: metallized recesses sized and shaped to retain the terminal contacts; metallized penetrating projections configured to penetrate the terminal contacts; metallized recesses with penetrating projections; and metal leads on polymer tape cantilevered over metallized recesses.

The interconnect also includes one or more cavities in the substrate configured to form flexible segments of the substrate, that allow the interconnect contacts to flex, and to move independently of one another, to accommodate variations in the size, location and planarity of the terminal contacts. A location and size of the cavities can be selected to form the flexible segments, with a desired compliancy, or spring constant. In addition, the cavities can be in flow communication with a pressurized fluid or gas source, such that a flexure of the interconnect contacts can be adjusted as required, for a particular testing application. Also, the pressurized cavities permit a variable backside biasing force to be exerted on the flexible segments, to counteract a biasing force applied from a front side of the interconnect by a testing apparatus such as a wafer prober or test carrier. Alternately, the cavities can be filled with an elastomeric material, selected to provide a desired compliancy, or spring constant, for the flexible segments and the substrate.

In a first embodiment the cavities comprise separate pockets, aligned with individual interconnect contacts. In a second embodiment the cavities comprise elongated grooves aligned with multiple interconnect contacts. In a third embodiment the cavity comprises a single pocket large enough to encompass a periphery of multiple interconnect contacts. The interconnect can be configured for die level testing of discrete components, such as bare dice or chip scale packages, or alternately for wafer level testing of multiple components contained on a common substrate, such as a wafer, a panel, a circuit board, or an electronic assembly. For a die level test system, the interconnect is configured for assembly in a testing apparatus, such as a carrier, configured to retain one or more components in electrical communication with testing circuitry. The testing apparatus includes a base on which the interconnect is mounted, and a force applying mechanism for biasing the components against the interconnect. For a wafer level test system, the interconnect is configured for use with a wafer testing apparatus, such as a wafer prober, or a wafer level burn-in system. In an illustrative wafer level test system the interconnect replaces a conventional probe card.

In an illustrative fabrication method, the interconnect comprises an etchable material such as silicon or ceramic, such that etching and metallization processes can be used to fabricate the interconnect contacts and cavities. Alternately the interconnect can comprise plastic, such that micromolding and metallization processes can be used to fabricate the interconnect contacts and cavities.

The test method includes the steps of: providing the interconnect, electrically engaging the component using the interconnect, and then allowing the interconnect contacts to move independently with a biasing force to accommodate variations in the size and planarity of the terminal contacts on the component. In addition, the test method can include the step of introducing a pressure into the cavities for adjusting a flexure of the interconnect contacts. The test method can also include the step of applying a front side biasing force, as well as a backside biasing force, to the interconnect contacts.

BRIEF DESCRIPTION OF THE DRAWINGS

FIGS. 7A–7D are schematic cross sectional views illustrating steps in a method for fabricating the interconnect contact of FIG. 3;

FIGS. 7E–7F are schematic cross sectional views illustrating steps in a method for fabricating the interconnect contact of FIG. 3A;

FIGS. 8A–8D are schematic cross sectional views illustrating steps in a method for fabricating the interconnect contact of FIG. 4;

FIG. 8E is a schematic cross sectional view illustrating a step in a method for fabricating the interconnect contact of FIG. 4A;

FIGS. 9A–9D are schematic cross sectional views illustrating steps in a method for fabricating the interconnect contact of FIG. 5;

FIGS. 10A–10E are schematic cross sectional views illustrating steps in a method for fabricating the interconnect contact of FIG. 6A;

DETAILED DESCRIPTION OF THE PREFERRED EMBODIMENTS

As used herein, the term "semiconductor component" refers to an electronic component, or assembly, that includes a semiconductor die. Exemplary semiconductor components include bare semiconductor dice, chip scale packages, ceramic or plastic semiconductor packages, BGA devices, semiconductor wafers, panels containing multiple chip scale packages, circuit boards, and electronic assemblies such as field emission displays.

Figure 1:
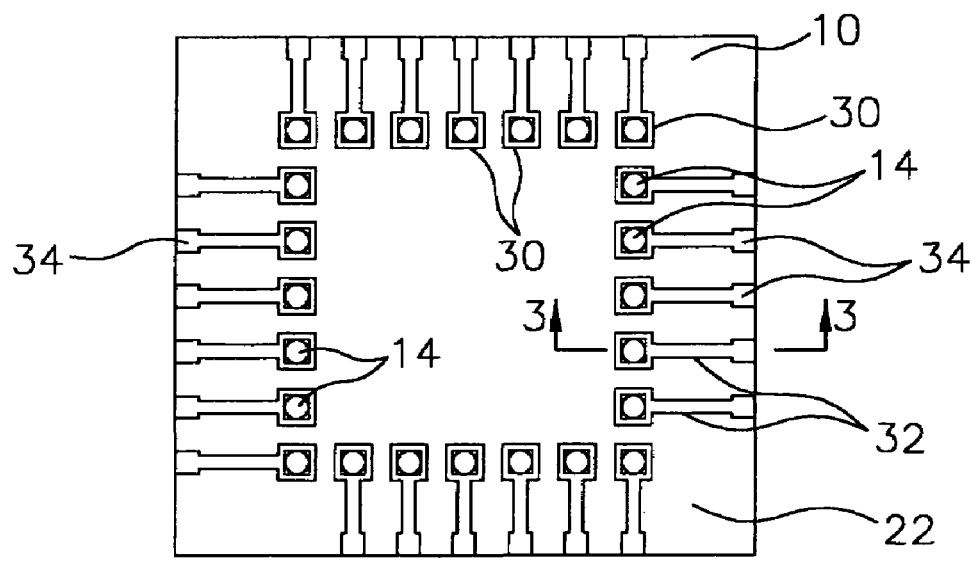
FIG. 1 is a schematic plan view of an interconnect constructed in accordance with the invention.
Figure 2:
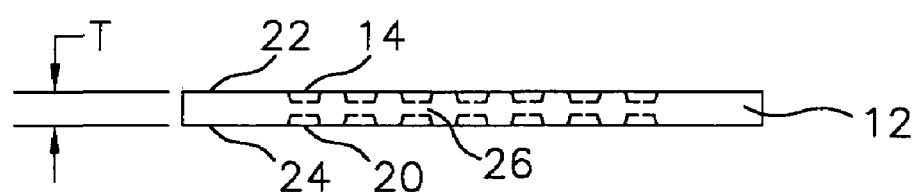
FIG. 2 is a side elevation view of FIG. 1.
Figure 1A:
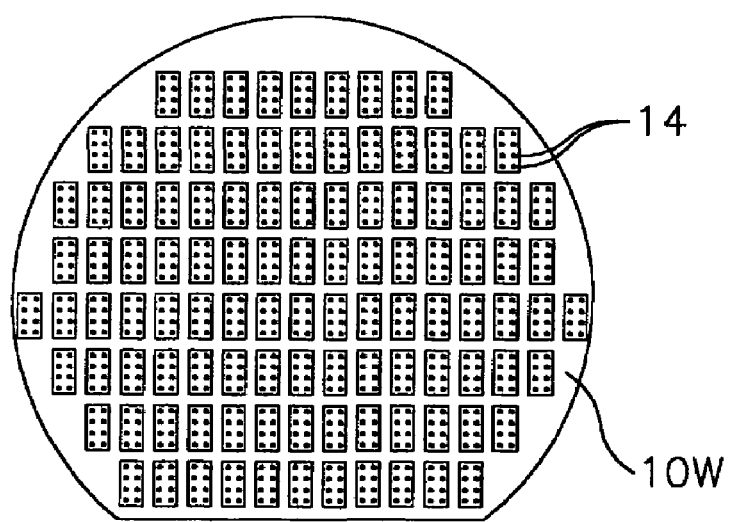
FIG. 1A is a plan view of an alternate embodiment wafer level interconnect constructed in accordance with the invention.
Figure 3:
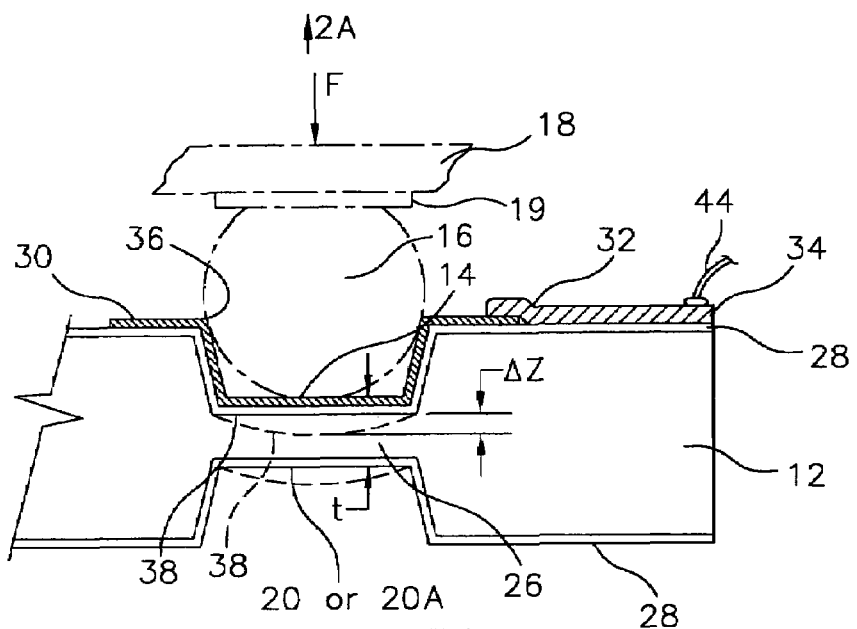
FIG. 3 is an enlarged cross sectional view taken along section line 3—3 of FIG. 1 illustrating an interconnect contact electrically engaging a bumped contact on a semiconductor component.

Referring to FIGS. 1–3, an interconnect 10 constructed in accordance with the invention is illustrated. The interconnect 10 includes a substrate 12, and a pattern of interconnect contacts 14 formed on the substrate 12. In the embodiment of FIG. 1, the interconnect 10 is configured for use with a singulated component 18 (FIG. 3) such as a bare semiconductor die, or a chip scale package. Alternately, as illustrated in FIG. 1A, an interconnect 10W can be configured for use with a wafer sized component 18W (FIG. 11) such as a semiconductor wafer, a panel, a board, or an electronic assembly.

Figure 3A:
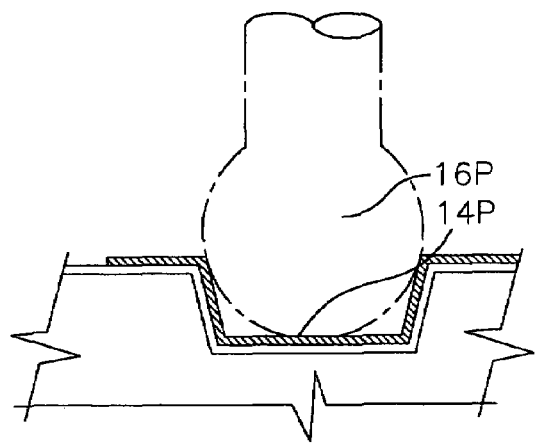
FIG. 3A is an enlarged cross sectional view equivalent to FIG. 3 of an alternate embodiment interconnect contact electrically engaging a pin contact.

Also in the embodiment of FIG. 1, the contacts 14 are configured to electrically engage bumped contacts 16 (FIG. 3) on a semiconductor component 18 (FIG. 3). The bumped contacts 16 (FIG. 3) are in electrical communication with the integrated circuits contained on the component 18, and function as electrical connection points from the outside for applying electronic signals to the integrated circuits. In addition, the bumped contacts 16 are depicted as generally spherically shaped balls attached to planar land pads 19. However, other shapes for the bumped contacts 16 such as half-spheres, domes, truncated cones, and hillocks can be electrically engaged using an interconnect constructed in accordance with the invention. Also, the bumped contacts 16 can comprise a metal such as solder, nickel or copper, or a conductive polymer, such as silver filled silicone, or fluorsilicone. Alternately, as shown in FIG. 3A, contacts 14P can be configured to electrically engage pin contacts 16P (or spring contacts), as disclosed in previously cited U.S. Pat. No. 5,495,667 to Farnworth et al.

As shown in FIG. 2, the interconnect 10 also includes a plurality of cavities 20 (FIG. 2), which form flexible segments 26 (FIG. 3) proximate to the contacts 14. During a test procedure performed using the interconnect 10, the flexible segments 26 allow the contacts 14 to flex, and to move independently in the z-direction relative to the component 18, in a manner to be hereinafter explained.

As also shown in FIG. 2, the substrate 12 comprises a generally planar structure having a front side 22 (first side), an opposing back side 24 (second side), and a thickness "T". The contacts 14 are formed on the front side 22 of the substrate 12, and the cavities 20 are formed on the back side 24 of the substrate 12. A size and peripheral shape of the substrate 12 can be selected as required.

Suitable materials for the substrate 12 include silicon, ceramic, and plastic. Depending on the material, the thickness T of the substrate 12 can be selected as required, with 10–50 mils or more being a representative thickness.

The interconnect contacts 14 are formed with a pattern (i.e., pitch and number) that exactly matches a pattern of the bumped contacts 16 on the semiconductor component 18. In the illustrative embodiment the pattern is four sided, to match a peripheral array pattern. However, the interconnect contacts 14 can be formed in any matching pattern used for semiconductor components. Representative patterns include dense grid arrays, such as a ball grid array (BGA), and linear patterns, such as center connect, or edge connect patterns.

In FIG. 2A, the cavities 20 are formed on the backside 24 of the substrate 12 substantially aligned with the interconnect contacts 14 on the front side 22 of the substrate 12. In addition, the cavities 20 have sizes and peripheral configurations, that are substantially the same as the sizes and peripheral configurations of the interconnect contacts 14. As illustrated the cavities 20 have a generally square peripheral configuration, but other geometrical shapes can be employed (e.g., rectangular, circular, oval). A depth "d" (FIG. 3) of the cavities 20 can be selected to provide the flexible segments 26 with a desired thickness "t" (FIG. 3). This thickness t is relatively small such that the flexible segment 26 is a thin membrane capable of deflection upon application of a moderate force.

A representative range for the thickness t of the flexible segment 26 can be from about 0.25–30 mils. The thickness t can also be selected to achieve a desired spring constant (C) for the flexible segment 26. The spring constant (C) is dependent on the dimensions and material for the flexible segment 26. These parameters can be related by the formula:

$$C = Ewt^3/4l^3$$

where
C is the spring constant
w is the width of the flexible segment 26
t is the thickness of the flexible segment 26
l is the length of the flexible segment 26
E is the modulus of elasticity of the substrate An alternate embodiment cavity 20B (FIG. 3B) can be formed on the back side 24 of a substrate 12A substantially as previously described for cavities 20 (FIG. 2A). However, rather than being aligned with individual contacts 14, the cavity 20B substantially encloses all of the contacts 14. In addition, peripheral edges of the cavity 20B substantially align with the outside peripheral edges of the contacts 14.

Alternate embodiment cavities 20A (FIG. 3) can also be formed on the back side 24 of a substrate 12B substantially as previously described for cavities 20 (FIG. 2A). However, rather than being aligned with individual contacts 14, the cavities 20A comprise elongated grooves that align with multiple contacts 14. In addition, peripheral edges of the cavities 20A substantially align with the outside peripheral edges of the contacts 14.

Referring to FIG. 3, the interconnect contact 14 is shown electrically engaging the bumped contact 16. The interconnect contact 14 comprises a recess 38 formed in the substrate 12, and a conductive layer 30 at least partially covering the recess 38.

The recess 38 is sized and shaped to retain the bumped contact 16. As will be further explained, the recess 38 can be formed by forming a mask (not shown) on the substrate 12, such as a photo patterned resist mask, and then etching the substrate 12 through an opening in the mask, using an etchant. A size and shape of the recess 38 will be determined by the opening in the etch mask used to etch the substrate 12. The recess 38 is configured to retain and electrically engage a single bumped contact 16. A representative diameter, or width, of the recess 38 can be from 0.002 inches (0.051 mm) to 0.050 inches (1.27 mm) or more. This diameter can be less than a diameter of the bumped contact 16 so that only portions thereof will be contacted. A depth of the recess 38 can be equal to, or less than, the diameter thereof. A pitch (or spacing) of the recess 38 relative to adjacent recesses 38 will exactly match a pitch of the bumped contacts 16 on the component 18.

As also shown in FIG. 3, the conductive layer 30 substantially covers the recess 38. In addition, peripheral edges 36 of the conductive layer 30 are adapted to penetrate the bumped contact 16 to pierce native oxide layers and contact the underlying metal. The conductive layer 30 is in electrical communication with a conductor 32, and with a bonding pad 34 on the substrate 12. The bonding pad 34 can be bonded to a wire 44, which forms an electrical path to the conductor 32, and to the conductive layer 30. As will be further explained, the wire 44 can also be bonded to a mating bonding pad on a test apparatus, such as a test carrier or wafer prober, which is in electrical communication with test circuitry.

The conductive layers 30, the conductors 32 and the bonding pads 34 can be made using semiconductor fabrication techniques (e.g., photolithography, etching, metallization) to be hereinafter described. Also, with the substrate 12 comprising silicon, electrically insulating layers 28, such as $SiO_2$, or a polymer material such as polyimide, can be formed on exposed surfaces to provide electrical insulation for the conductive layers 30, the conductors 32 and the bonding pads 34, from the remainder of the substrate 12. If the substrate 12 comprises an electrically insulating material such as ceramic or plastic, the insulating layers 28 are not required.

Suitable metals for the conductive layers 30 and the conductors 32 include aluminum, chromium, titanium, nickel, iridium, copper, gold, tungsten, silver, platinum, palladium, tantalum, molybdenum or alloys of these metals such as $TiSi_2$. The conductive layers 30, and the conductors 32 can be formed as a single layer of metal, or as a multi metal stack, using a thin film metallization process (e.g., CVD, patterning, etching or electroplating). Alternately, a thick film metallization process (e.g., screen printing, stenciling) can be used to form the conductive layers 30 and the conductors 32.

The alternate embodiment contact 14P of FIG. 3A can be constructed substantially as described for contact 14 (FIG. 3) but sized to engage the pin contact 16P.

As shown in FIG. 3, during a test procedure, a biasing force F can be applied to the component 18 (or to the interconnect 10) for biasing the component 18 and the interconnect 10 together. As will be further explained, the biasing force F can be generated by the test apparatus (e.g., wafer prober, test carrier) on which the interconnect 10 is mounted. During biasing, the flexible segment 26 allows the interconnect contact 14 to move as the bumped contact 16 on the component 18 is pressed into the interconnect contact 14. For example, the flexible segment 26 can bow outward as indicated by the dotted lines in FIG. 3, permitting deflection of the interconnect contact 14 by an amount ΔZ. This movement can compensate for variations in the size (i.e., height, diameter) and the planarity of the bumped contacts 14. In addition, different contacts 16 on the substrate 12 can move independently of one another. This allows the z-direction location of the contacts 14 to adjust to the location of the bumped contacts 16 on the component 18.

The amount of the deflection ΔZ can be controlled by selection of the force F, and by selection of the spring constant C for the flexible segment 26. By way of example, and not limitation, a representative range for the deflection ΔZ can be from several microns to several mils.

Figure 3B:
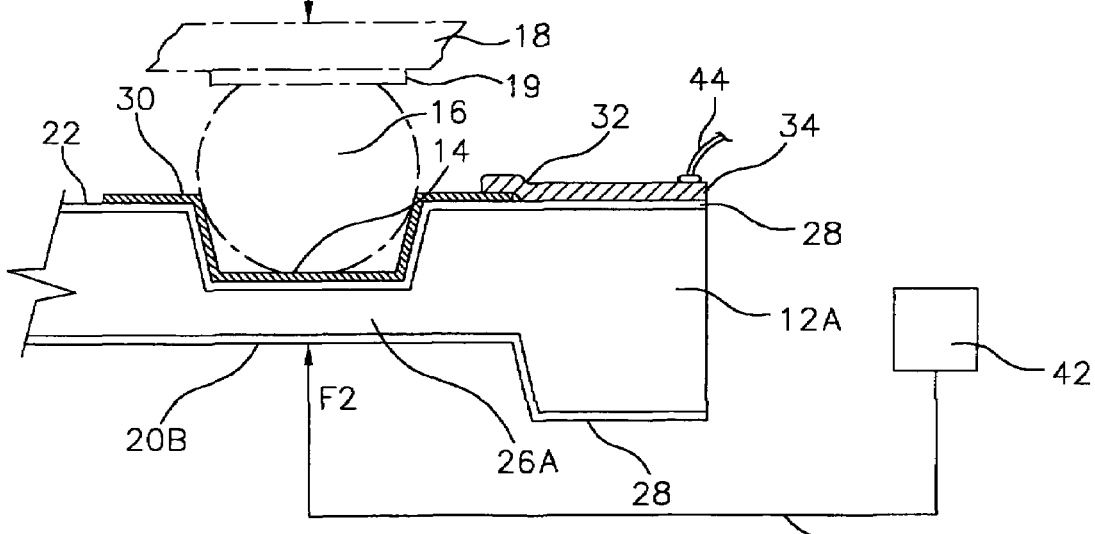
FIG. 3B is an enlarged cross sectional view equivalent to FIG. 3 of an alternate embodiment interconnect contact electrically engaging the bumped contact.

Referring to FIG. 3B, the alternate embodiment substrate 12A and cavity 20B are illustrated. The cavity 20B was previously shown in FIG. 2B, and has a peripheral outline that is larger than the area occupied by the contacts 14 on the front side 22 of the substrate 12A. In addition, the cavity 20B can be in flow communication with a pressure conduit 40 which is coupled to a pressure source 42. As will be further explained the pressure conduit 40 is preferably contained on a separate mounting substrate for the interconnect 10. Alternately, the pressure conduit 40 can comprise a passageway in the substrate 12A.

The pressure source 42 can comprise a source of compressed gas, such as air, or a source of pressurized fluid, such as water or oil. Using the pressure source 42 and the pressure conduit 40, gas or liquid pressure can be applied to the cavity 20B. This exerts a backside force F2 on the flexible segments 26A, and on a backside of the interconnect contacts 14. At the same time, a front side force F1 can be exerted by the testing apparatus on the component 18, on the bumped contacts 16, and on the front side of the interconnect contacts 14, substantially as previously described. The backside force F2 can be selected relative to the front side force F1 such that a desired net biasing force biases the interconnect contacts 14 and the bumped contacts 16 together.

Figure 4:
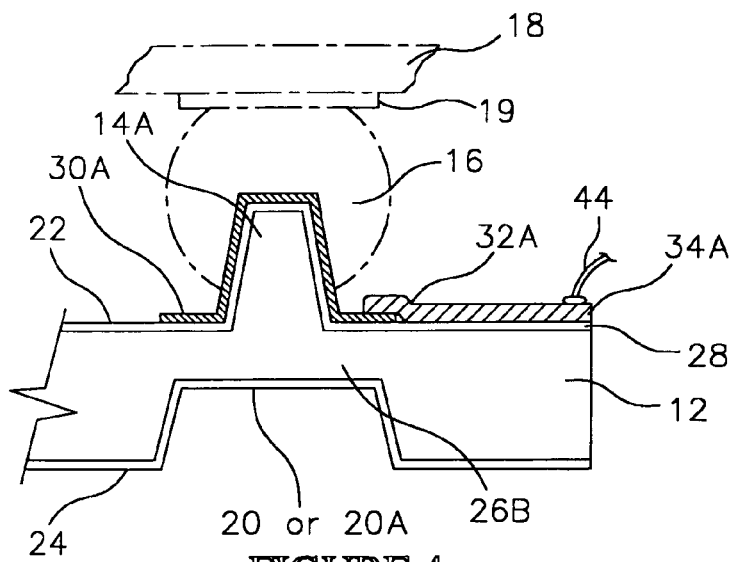
FIG. 4 is an enlarged cross sectional view equivalent to FIG. 3 of another alternate embodiment interconnect contact electrically engaging the bumped contact.

Referring to FIG. 4, an alternate embodiment interconnect contact 14A is illustrated. The interconnect contact 14A comprises a metallized projection on the substrate 12 which can be formed using an etching process to be hereinafter described. The interconnect contact 14A is sized and shaped to penetrate the bumped contact 16 on the component 18. A representative width for the interconnect contact 14A, for a bumped contact 16 having a diameter of about 0.35 mm, can be about 20–50 μm on a side, and about 50–100 μm high.

As with the interconnect contact 14, the interconnect contact 14A is at least partially covered with a conductive layer 30A. The conductive layer 30A is in electrical communication with a conductor 32A, and with a bonding pad 34A on the substrate 12. In addition, previously described electrically insulating layers 28, electrically insulate the conductive layer 30A and conductor 32A from the substrate 12. As with interconnect contact 14, the interconnect contact 14A is located on the front side 22 of the substrate 12, and the cavity 20 or 20A is located on the back side 24 of the substrate 12. In addition, the cavity 20 or 20A allows the contact 14A to move in the z-direction relative to the component 18 to compensate for variations in the size and planarity of the bumped contact 16.

Figure 4A:
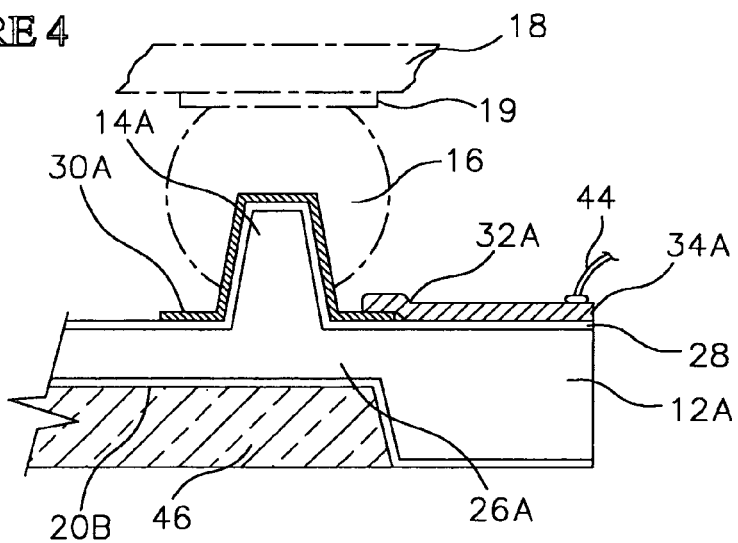
FIG. 4A is an enlarged cross sectional view equivalent to FIG. 4 of another alternate embodiment interconnect contact electrically engaging the bumped contact.

Referring to FIG. 4A, the interconnect contact 14A is illustrated on the substrate 12A having the previously described single cavity 20B. However, in this embodiment an elastomer 46 is placed in the cavity 20B to provide a resilient backing for the flexible segment 26A, and thus a desired compliancy or flexibility for the substrate 12A, and for the interconnect contacts 14A on the substrate 12A. The elastomer 46 can comprise a resilient, flexible material, such as silicone, butyl rubber, or an elastomeric foam.

Figure 5:
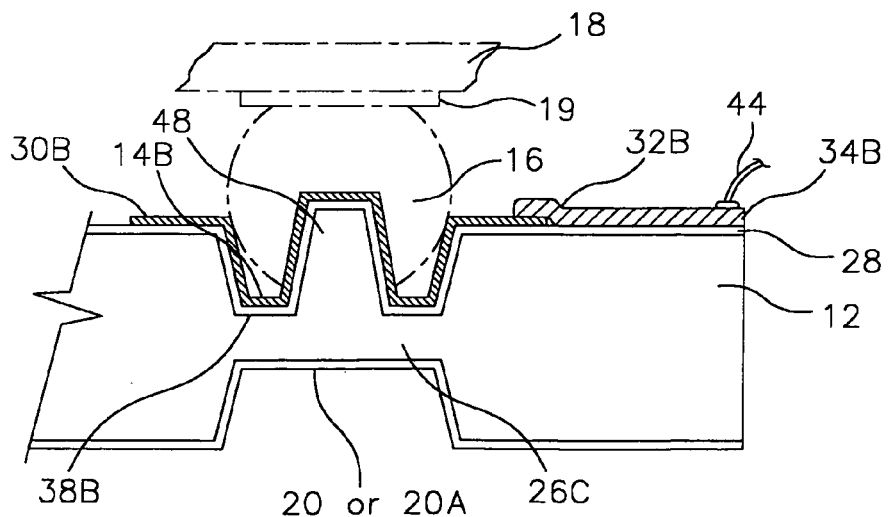
FIG. 5 is an enlarged cross sectional view equivalent to FIG. 3 of another alternate embodiment interconnect contact.

Referring to FIG. 5, an alternate embodiment interconnect contact 14B is illustrated. The interconnect contact 14B is substantially similar to the interconnect contact 14 (FIG. 3) previously described. The interconnect contact 14B comprises a recess 38B in the substrate 12 sized and shaped to retain, and center the bumped contact 16. In addition, the interconnect contact 14B includes at least one projection 48 within the recess 38B for penetrating the bumped contact 16. The recess 38B and projection 48 are at least partially covered with conductive layer 30B, substantially equivalent to the conductive layer 30 (FIG. 3) previously described. In addition, previously described insulating layers 28 electrically insulate the conductive layer 30B and conductor 32B. As with the previous embodiments, the cavity 20 or 20A forms flexible segment 26C that allows the interconnect contact 14B to move independently in the z-direction, to accommodate variations in the size and planarity of the bumped contact 16 relative to other bumped contacts 16 on the component 18.

Figure 5A:
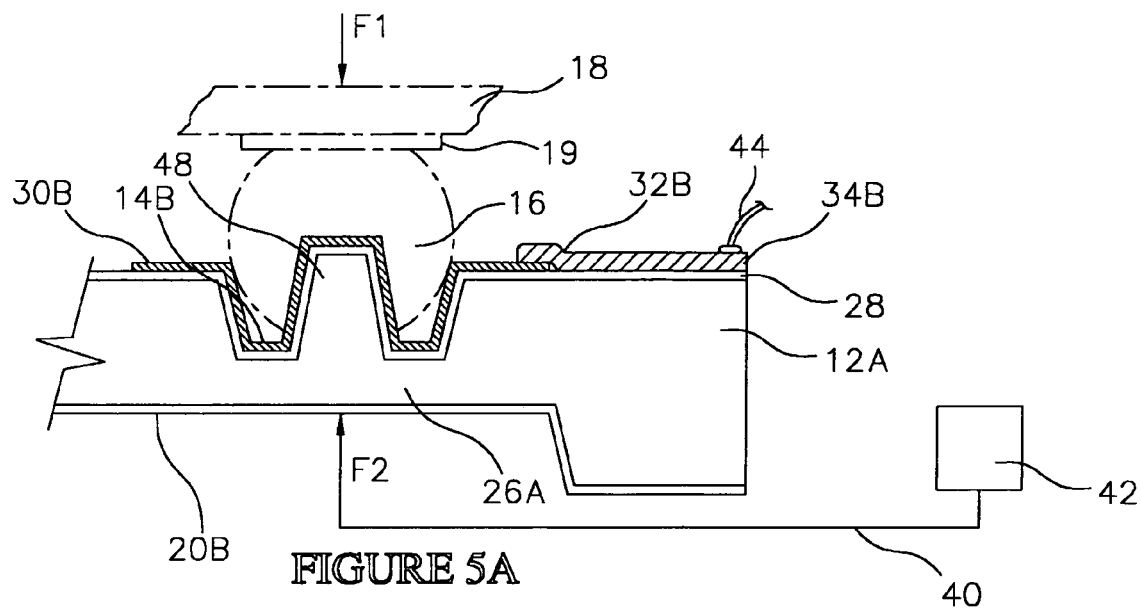
FIG. 5A is an enlarged cross sectional view equivalent to FIG. 5 of the another alternate embodiment interconnect electrically engaging the bumped contact.

Referring to FIG. 5A, the interconnect contact 14B is illustrated on the substrate 12A having the previously described single cavity 20B. In addition, the cavity 20B is in flow communication with the pressure conduit 40 and the pressure source 42, such that the forces F1 and F2 can be adjusted as previously described.

Referring to FIGS. 6A–6D an alternate embodiment interconnect contact 14C is illustrated. The interconnect contact 14C includes a recess 38C formed on a front side 22C of a substrate 12C, substantially as previously described. In addition, the recess 38C is at least partially covered with a conductive layer 30C, substantially as previously described. Electrically insulating layers 28C, such as SiO₂, or a polymer layer, electrically insulate the conductive layer 30C from a bulk of the substrate 12C. If the substrate 12C comprises an electrically insulating material such as ceramic or plastic, the insulating layers 28C are not required.

The interconnect contact 14C also includes a polymer tape 50 similar to multi layered TAB tape used widely in semiconductor packaging. As will be more fully described, the polymer tape 50 can be formed separately out of polyimide, or similar material, and then attached to the front side 22C of the substrate 12C. The polymer tape 50 includes leads 52 configured to cantilever over the recess 38C, and to electrically engage the bumped contact 16. The leads 52 can move independently in the z-direction relative to the leads on other interconnect contacts 14C, to accommodate variations in the size or planarity of the bumped contacts 16. In the illustrative embodiment there are four leads 52 arranged in a generally orthogonal, spoke-like pattern. However, a greater or lesser number of leads 52 and other patterns for the leads 52 (e.g., spiral) can be employed. The leads 52 can be formed by depositing (e.g., electrodepositing) or attaching (e.g., laminating) a metal layer to the polymer tape 50 and then patterning the metal layer. The leads 52 include a generally square-shaped, integrally-formed, connecting segment 56 that connects the leads 52 to one another. Also, openings 54 can be formed in the polymer tape 50, by etching or other suitable process, in a pattern that corresponds to the pattern of the recesses 38C. The openings 54 provide access to the leads 52 for the bumped contact 16.

Figure 6A:
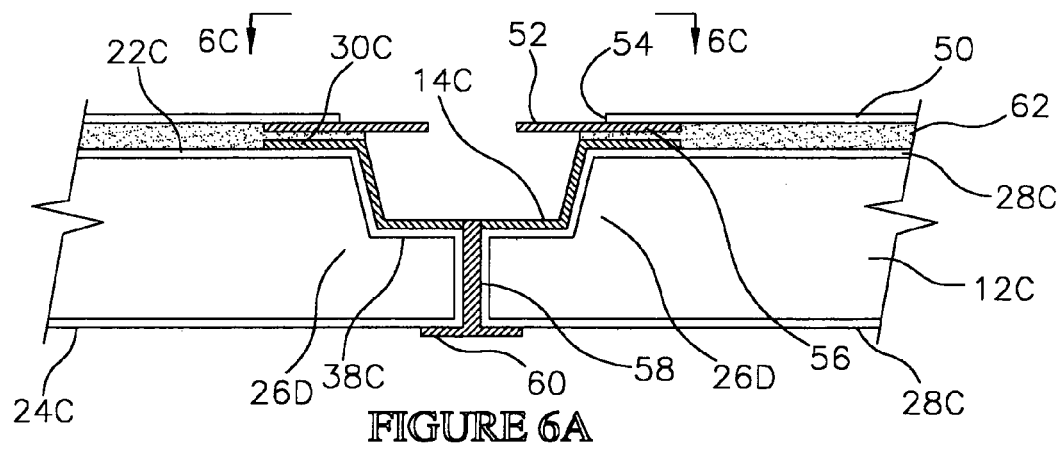
FIG. 6A is an enlarged cross sectional view equivalent to FIG. 3 of another alternate embodiment interconnect contact.
Figure 6B:
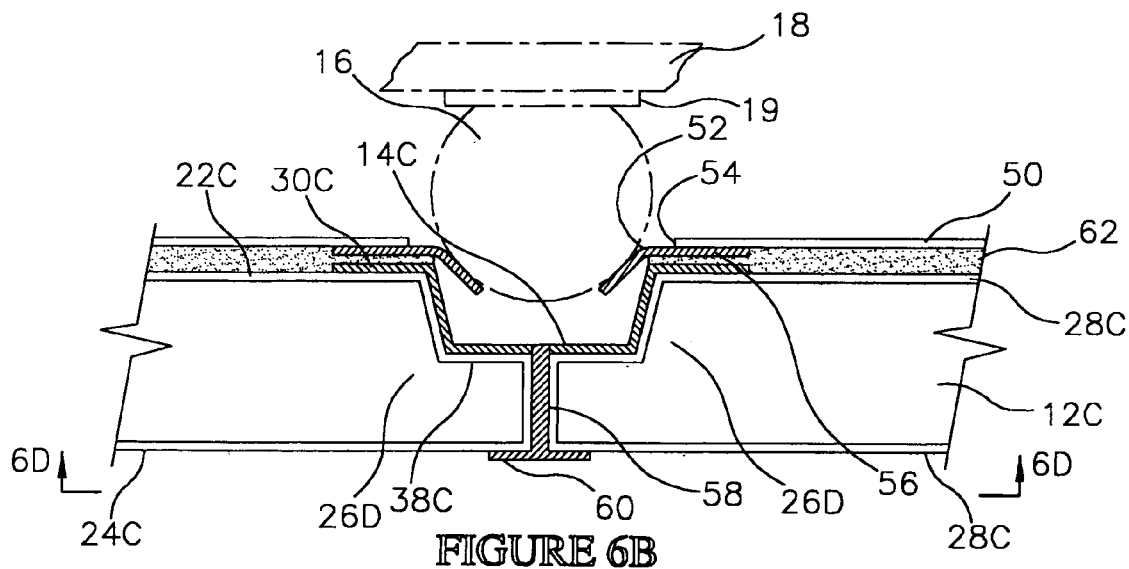
FIG. 6B is an enlarged cross sectional view of the interconnect contact of FIG. 6A electrically engaging the bumped contact.
Figure 6C:
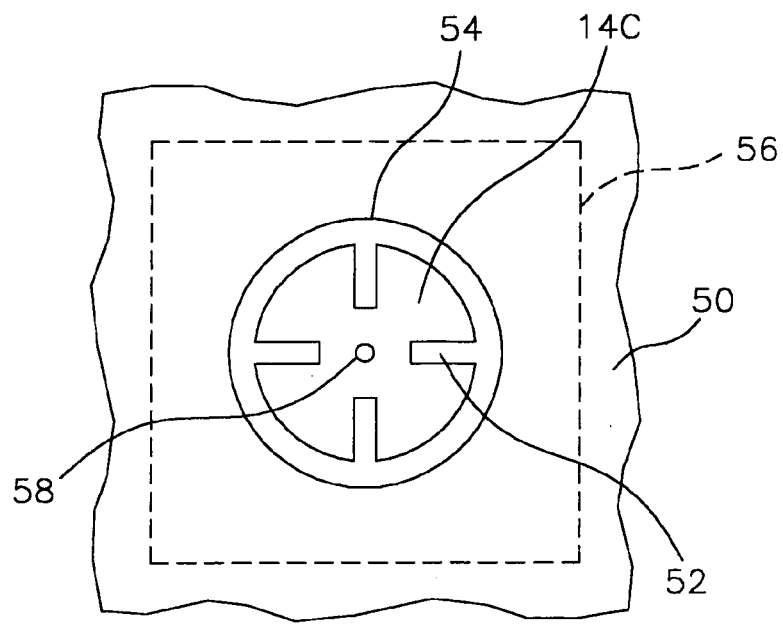
FIG. 6C is a plan view taken along section line 6C—6C of FIG. 6A.
Figure 6D:
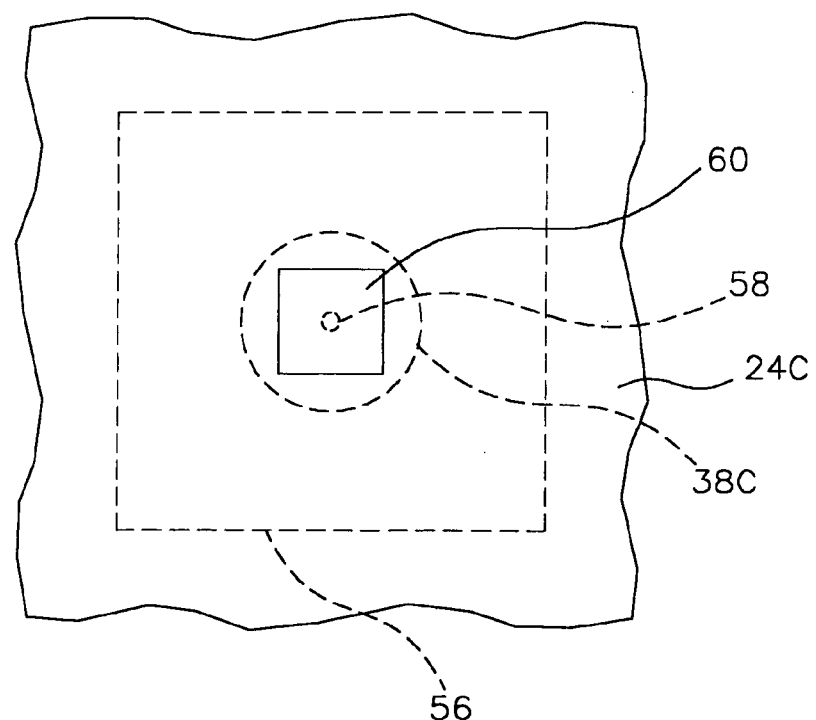
FIG. 6D is a bottom view taken along section line 6D—6D of FIG. 6B.

Still referring to FIG. 6A, the interconnect contact 14C also includes a conductive via 58 in the substrate 12C in electrical communication with the conductive layer 30C.

The conductive via 58 can be formed using a laser machining process to be hereinafter described. The conductive via 58 includes a contact pad 60 formed on a back side 24C of the substrate 12C. In addition, electrically insulating layers 28C electrically insulate the conductive via 58 and the contact pad 60. The conductive via 58 and the contact pad 60 provide a conductive path from the back side 24C of the substrate 12C to the conductive layer 30C for the interconnect contact 14C located on the front side 22C of the substrate 12C. The conductive layer 30C is also in electrical communication with a conductive polymer layer 62 on the substrate 12C. The conductive polymer layer 62 electrically connects the conductive layer 30C to the leads 52. The conductive polymer layer 62 can comprise an isotropic conductive material, such as silver filled silicone or flourosilicone, or an anisotropic conductive material such as a z-axis anisotropic adhesive.

Referring to FIGS. 7A–7D, steps in a method for fabricating the interconnect 10 with interconnect contacts 14 (FIG. 3) are illustrated. Initially, the substrate 12 having the front side 22 and the backside 24 can be provided. Preferably the substrate 12 comprises a wafer of material, such that a wafer level fabrication process can be employed to make the interconnect 10. In the case of a wafer level interconnect 10W (FIG. 1A), the substrate 12 can have the same size and peripheral configuration as the completed interconnect 10W. In the case of a die level interconnect 10 (FIG. 1), a singulation process, such as cutting or shearing, can be used to separate multiple interconnects 10 from the substrate 12. The separated interconnects 10 will then have a peripheral shape corresponding to the component being tested.

The substrate 12 can comprise an etchable material such as monocrystalline silicon, silicon-on-glass, silicon-on-sapphire, or germanium. The substrate 12 can also comprise a plastic material such as a glass reinforced resin (e.g., FR-4), or a moldable electronics grade plastic such as a thermoplastic plastic, a thermosetting plastic or a liquid crystal polymer. A representative thickness of the substrate 12 can be about 20–50 mils or greater.

Next, as shown in FIG. 7B, a front side etch mask 64 can be formed on the front side 22 of the substrate 12, and used to etch the recess 38. Similarly, a back side etch mask 66 can be formed on the back side 24 of the substrate 12, and used to etch the cavity 20 or 20A. The etch masks 64, 66 can comprise a polymer resist, or a hard mask such as $Si_3N_4$. In addition, a wet etchant, such as KOH for silicon, can be used to anisotropically etch the substrate 12 through openings in the masks 64, 66. Alternately an isotropic etch process, with a wet etchant such as $HF/HNO_3$ for silicon, can be employed. If the substrate 12 comprises ceramic, a suitable wet etchant, such as HF, can be utilized to etch the recess 38 and the cavity 20 or 20A. If the substrate 12 comprises plastic rather than an etchable material, a micro molding process can be used to form the recess 38, and the cavity 20 or 20A.

In the illustrative embodiment the recess 38 and the cavity 20 or 20A have a same depth and a same width. Alternately, separate etch processes can be employed such that the recess 38 and the cavity 20 or 20A can be formed with different depths and widths. The thickness of the substrate 12, and the depth of the recess 38 and cavity 20 or 20A, can be selected to form the flexible segment 26 with a desired thickness t.

Next, as shown in FIG. 7C, the insulating layers 28 can be formed within the recess 38, within the cavity 20 or 20A, on the front side 22 of the substrate 12, and on the back side 24 of the substrate 12. The insulating layers 28 can comprise an electrically insulating material, such as $SiO_2$, or $Si_3N_4$, deposited to a desired thickness using CVD, or other deposition process. With silicon, a $SiO_2$ layer can also be grown on exposed surfaces of the substrate 12 using an oxidizing atmosphere such as steam and $O_2$ at an elevated temperature (e.g., 950° C.). The insulating layers 28 can also comprise an electrically insulating polymer, such as polyimide, deposited and planarized using a suitable process (e.g., spin-on-process). Depending on the material, a representative thickness of the insulating layers 28 can be from about a 100 Å to several mils. If the substrate 12 comprises an electrically insulating material such as ceramic or plastic, the insulating layers 28 are not required.

Next, as shown in FIG. 7D, the conductive layer 30 can be formed on the recess 38. The conductive layer 30 can comprise a thin film metal deposited to a thickness of several hundred Å, or more, using a process such as CVD. In the illustrative embodiment the conductive layer 30 completely covers the recess 38, and as shown in FIG. 1 has a generally square peripheral configuration. Alternately, the conductive layer 30 can partially cover the recess 38, and can be formed with a different peripheral configuration (e.g., circular, rectangular, oval).

As also shown in FIG. 7D, the conductors 32 and the bonding pads 34 can be formed at the same time as the conductive layer 30, or can be formed using a separate metallization process. The conductive layers 30 and conductors 32 can comprise a patterned layer of a conductive metal such as aluminum, chromium, titanium, nickel, iridium, copper, gold, tungsten, silver, platinum, palladium, tantalum, molybdenum, or alloys of these metals such as $TiSi_2$. Rather than being a single layer of metal, the conductive layer 30 and the conductors 32 can comprise multi-layered stacks of metals (e.g., bonding layer/barrier layer). The bonding pads 34 can be formed using a same process as the conductors 32 or can be formed separately. Preferably the bonding pads 34 comprise a metal, such as aluminum or copper, on which wire bonds can be easily formed.

As shown in FIG. 7E, for fabricating the embodiment of FIG. 5A with the single cavity 20B, a suitable back side etch mask 66A can be formed on the substrate 12A. The single cavity 20B, can then be formed using an etching process substantially as previously described. Alternately for a plastic substrate 12A, the cavity 20B can be formed using a micro molding process.

As shown in FIG. 7F, for introducing a fluid or gas pressure into the cavity 20B, the substrate 12A can be attached to a mounting substrate 68 containing the pressure conduit 40. The mounting substrate 68 can comprise a suitable material such as plastic or ceramic that is molded or etched with the pressure conduit 40. In addition, the substrate 12A can be attached to the mounting substrate 68 using a suitable adhesive such as silicone, such that a liquid or gas tight seal is formed between the substrate 12A and the mounting substrate 68.

Referring to FIGS. 8A–8D, steps in a method for fabricating the interconnect 10 with contacts 14A (FIG. 4) are illustrated. Initially, as shown in FIG. 8A, the substrate 12 can be provided, as previously described.

Next, as shown in FIG. 8B a front side etch mask 70 can be formed on the front side 22 of the substrate 12, and used to etch the contact 14A, substantially as previously described. A representative height of the contact 14A can be about 25 μm to 100 μm and a representative width can be about 25 μm to 50 μm on a side. Similarly, a back side mask 72 can be formed on the back side 24 of the substrate 12 and used to etch the cavities 20 or 20A, substantially as previously described.

Next, as shown in FIG. 8C, the insulating layers 28 can be formed, substantially as previously described.

Next, as shown in FIG. 8D, the conductive layer 30A, conductor 32A, and bonding pad 34A can be formed substantially as previously described.

As shown in FIG. 8E, for the embodiment of FIG. 4A, the elastomer 46 can be deposited within the cavity 20B. With the elastomer 46 comprising silicone or an elastomeric foam, the elastomer 46 can be deposited in viscous form using a suitable deposition apparatus, such as a nozzle or spatula, and then cured as required. Alternately, the elastomer 46 can comprise a separate elastomeric member such as butyl rubber, placed within the cavity 20B and secured with an adhesive.

Referring to FIGS. 9A–9D steps in a method for fabricating the interconnect 10 with contacts 14B (FIG. 5) are illustrated. Initially as shown in FIG. 9A, the substrate 12 can be provided as previously described.

Next, as shown in FIG. 9B, a front side etch mask 74 can be formed on the front side 22 of the substrate 12, and used to etch the contact 14B with the projection 48, substantially as previously described. Similarly, a back side etch mask 76 can be formed on the back side 24 of the substrate 12 and used to etch the cavities 20 or 20A, substantially as previously described.

Next, as shown in FIG. 9C, the insulating layers 28 can be formed substantially as previously described.

Next, as shown in FIG. 9D, the conductive layer 30B, conductor 32B, and bonding pad 34B can be formed, substantially as previously described.

Referring to FIGS. 10A–10D steps in a method for fabricating the interconnect 10 with contacts 14C (FIG. 6A) are illustrated. Initially, as shown in FIG. 10A, the substrate 12C can be provided as previously described.

Next, as shown in FIG. 10B a front side etch mask 78 can be formed on the front side 22C of the substrate 12C, and used to etch the recess 38C, substantially as previously described. If the substrate 12C comprises plastic, a micro molding process, or a laser machining process, can be used to form the recess 38C.

Next, as shown in FIG. 10C, an opening 82 can be formed in the substrate 12C. The opening 82 extends from the bottom surface of the cavity 38C to the back side 24C of the substrate 12C, and will be used to form the conductive via 58 (FIG. 6A). One method for forming the opening 82 is with a laser machining process. Suitable laser machining apparatus include the previously identified General Scanning and Synova units. A representative diameter of the opening 82 can be from 10 μm to 2 mils or greater. A representative laser fluence for forming the opening 82 through a substrate 12C comprising silicon and having a thickness of about 28 mils is from 2 to 10 watts/per opening at a pulse duration of 20–25 ns and at a repetition rate of up to several thousand per second. The wavelength of the laser beam can be a standard infrared or green wavelength (e.g., 532 nm–1064 nm).

As also shown in FIG. 10C, the insulating layers 28C can be formed substantially as previously described. The insulating layers 28C cover exposed surfaces of the substrate 12C, including the recess 38C and the opening 82. If the substrate 12C comprises ceramic or plastic the insulating layers 28C are not required.

Next, as shown in FIG. 10D, the opening 82 can be filled with a conductive material to form the conductive via 58. The conductive material can completely fill the opening 82, or alternately cover only the sidewalls of the opening 82. A suitable deposition process, such as CVD, electrolytic deposition, or electroless deposition can be used to deposit a conductive material such as nickel into the opening 82. Alternately, a solder alloy can be screen printed into the opening 82, or injected by capillary action. Also, rather than being a metal, the conductive material can comprise a conductive polymer, such as a metal filled silicone, a carbon filled ink, or an isotropic or anisotropic adhesive.

As also shown in FIG. 10D, the conductive layer 30C can be formed using a metallization process substantially as previously described. In addition, the contact pad 60 can be formed using a metallization process. The conductive via 58 forms an electrical path between the conductive layer 30C and the contact pad 60.

Next as shown in FIG. 10E, the polymer tape 50 can be attached to the substrate 12C using the conductive polymer layer 62. Initially, the conductive polymer layer 62 can be deposited on the substrate 12C using a suitable deposition process such as screen printing or stenciling, and the polymer tape 50 can be attached to the conductive polymer layer 62. The conductive polymer layer 62 will electrically connect the conductive layer 30C on the substrate 12C to the leads 52 on the polymer tape 50. In addition, the conductive polymer layer 62 functions to attach the polymer tape 50 to the substrate 12C. The conductive polymer layer 62 can comprise a metal filled silicone, a silver filled ink, an isotropic adhesive, or an anisotropic adhesive. Suitable conductive polymer materials are sold by A.I. Technology, Trenton, N.J.; Sheldahl, Northfield, Minn.; 3M, St. Paul, Minn. Alternately rather than being initially applied to the substrate 12C, the conductive polymer layer 62 can be initially applied to the polymer tape 50. In the case of isotropic materials, the conductive polymer layer 62 can be formed only on selected portions of the substrate 12C to prevent shorting of the contacts 14C.

The polymer tape 50 can be applied to the conductive polymer layer 62 while it is in a viscous state. Curing of the conductive polymer layer 62 can then be performed. Depending on the material, the conductive polymer layer 62 can be cured using heat and compression as required. Prior to attaching the polymer tape 50 to the conductive polymer layer 62, the leads 52 can be aligned with the recess 38C in the substrate 12C. As previously explained, the polymer tape 50 can be similar to multi layered TAB tape, and can be fabricated using techniques that are known in the art. For example, the leads 52 can be formed in a desired configuration on a polyimide film using an electrodeposition process. Also required features such as the opening 54 (FIG. 6A) can be formed in the film as required.

Wafer Level Test System

Figure 11:
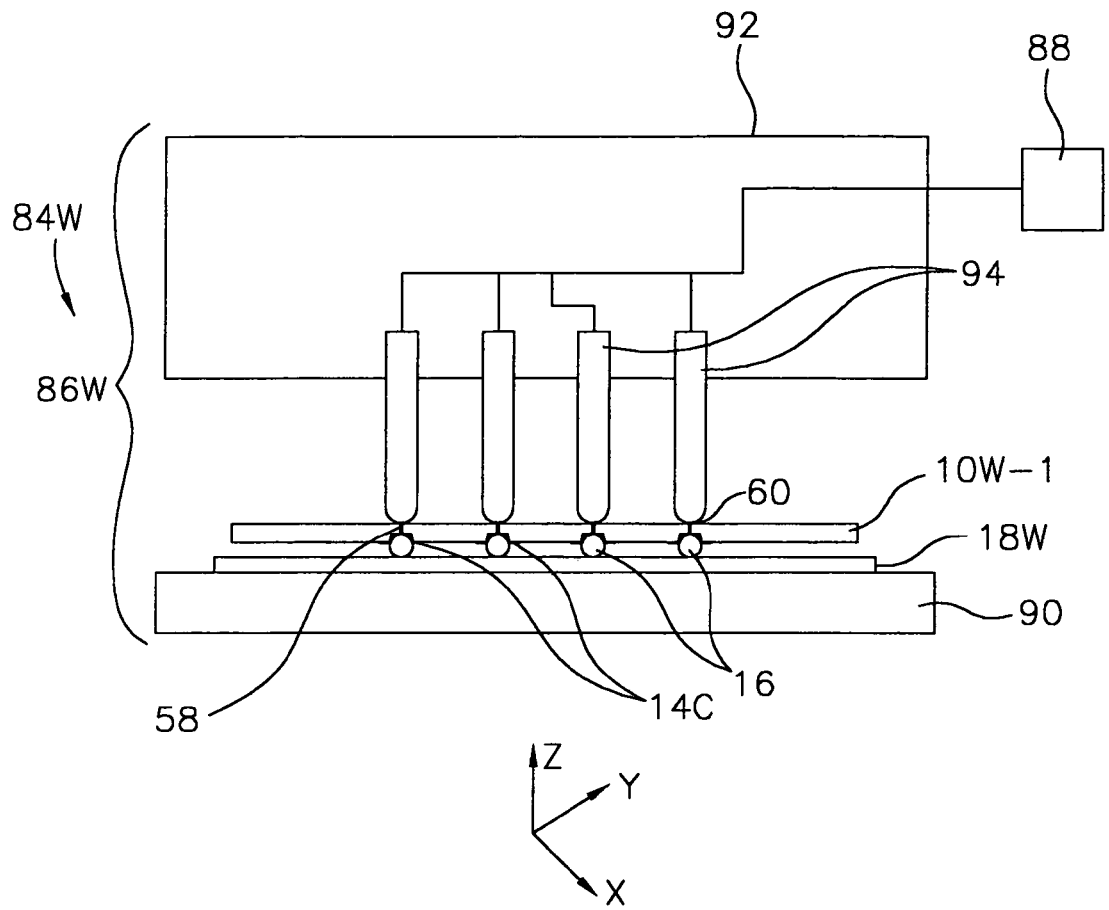
FIG. 11 is a schematic diagram of a wafer level test system constructed in accordance with the invention.

Referring to FIG. 11, a wafer level test system 84W suitable for testing a wafer sized semiconductor component 10W with bumped contacts 16 is illustrated. The semiconductor component 10W can comprise a semiconductor wafer containing bare dice, a wafer or panel containing chip scale packages, a printed circuit board containing semiconductor dice, or an electronic assembly, such as a field emission display containing semiconductor dice.

The wafer level test system 84W includes an interconnect 10W-1 constructed in accordance with the invention as previously described, and mounted to a testing apparatus 86W. The testing apparatus 86W includes, or is in electrical communication with test circuitry 88. The testing apparatus 86W can comprise a conventional wafer probe handler, or probe tester, modified for use with the interconnect 10W-1. The testing apparatus 86W can also comprise a wafer level burn-in system. Wafer probe handlers and associated test equipment are commercially available from Electroglass, Advantest, Teradyne, Megatest, Hewlett-Packard and others. In this system 84W, the interconnect 10W-1 takes the place of a conventional probe card.

The interconnect 10W-1 includes the previously described interconnect contacts 14C configured to establish electrical communication with the bumped contacts 16 on the component 10W. In addition, the leads 52 (FIG. 6B) on the interconnect contacts 14C can move independently in the z-direction to accommodate variations in the size and planarity of the bumped contacts 16. The interconnect 10W-1 also includes the previously described conductive vias 58 in electrical communication with the contacts 14C and the contact pads 60. Alternately, the interconnect 10W-1 can be configured with previously described contacts 14, 14A or 14B.

The testing apparatus 86W also includes a wafer chuck 90 configured to support and move the component 18W in x, y and z directions as required. In particular, the wafer chuck 90 can be used to step the component 18W so that the semiconductor dice or semiconductor packages on the component 18W can be tested in groups. Alternately, the interconnect 10W-1 can be configured to contact all of the bumped contacts 16 for all of the dice on the component 18W at the same time. Test signals can then be selectively applied and electronically switched as required, to selected dice on the component 18W.

As also shown in FIGS. 11, the interconnect 10W-1 can mount to a probe card fixture 92 of the testing apparatus 86W. The probe card fixture 92 can be similar in construction to a conventional probe card fixture commercially available from manufacturers such as Packard Hughes Interconnect and Wentworth Laboratories. The probe card fixture 92 can be formed of an electrically insulating material such as FR-4 or ceramic. In addition, the testing apparatus 86W can include a force applying mechanism in the form of multiple spring loaded electrical connectors 94 associated with the probe card fixture 92. The spring loaded electrical connectors 94 are in electrical communication with the testing circuitry 88.

The spring loaded electrical connectors 94 can be formed in a variety of configurations. One suitable configuration is known as a "POGO PIN" connector. This type of electrical connector includes a spring loaded pin adapted to contact and press against a flat or bumped surface to form an electrical connection. Pogo pin connectors are manufactured by Pogo Instruments, Inc., Kansas City, Kans. The spring loaded electrical connectors 94 can also comprise wires, pins or cables formed as spring segments or other resilient members.

In this embodiment the spring loaded electrical connectors 94 electrically contact the contact pads 60 formed on the interconnect 10W-1. This arrangement provides separate electrical paths from the testing circuitry 88, through the spring loaded electrical connectors 94, through the contact pads 60, through the conductive vias 58 and through the contacts 14C to the bumped contacts 16. During a test procedure, test signals can be applied to the integrated circuits on the component 18W using these separate electrical paths.

In addition to establishing electrical communication with the interconnect 10W-1, the spring loaded electrical connectors 94 also provide a mechanical force necessary for biasing the interconnect 10W-1 against the component 18W. Further details of a wafer level system similar to the system 86W are contained in U.S. patent application Ser. No. 08/797,719, filed Feb. 10, 1997, entitled "PROBE CARD FOR SEMICONDUCTOR WAFERS AND METHOD AND SYSTEM FOR TESTING WAFERS" which is incorporated herein by reference.

Figure 11A:
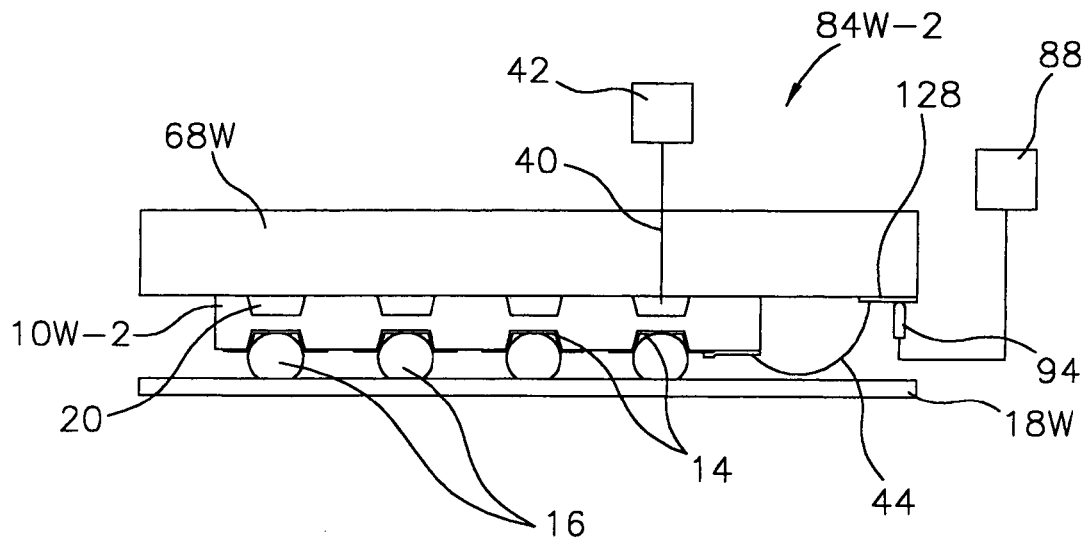
FIG. 11A is a schematic diagram of an alternate embodiment wafer level test system.

Referring to FIG. 11A, an alternate embodiment wafer level test system 84W-2 is illustrated. The wafer level test system 84W-2 includes an interconnect 10W-2 that takes the place of a conventional probe card on a wafer probe handler substantially as previously described for interconnect 10W (FIG. 11). The interconnect 10W-2 includes contacts 16 and cavities 20 formed substantially as previously described. In addition, the interconnect 10W-2 is mounted to a mounting substrate 68W that is configured to seal the cavities 20, such that fluid or gas pressure can be introduced through pressure conduits 40 into the cavities 20. The mounting plate 68W includes contact pads 128 wire bonded to wires 44. The wires 44 are also wire bonded to the bonding pads 34 (FIG. 1) on the interconnect 10W-2 and are thus in electrical communication with the contacts 14. The contact pads 128 are configured for electrical engagement by spring loaded electrical connectors 94 in electrical communication with test circuitry 88. In this embodiment, the pressure within the cavities 20 can be controlled to exert a selected backside biasing force on the contacts 14, substantially as previously described.

Die Level Test System

Figure 12A:
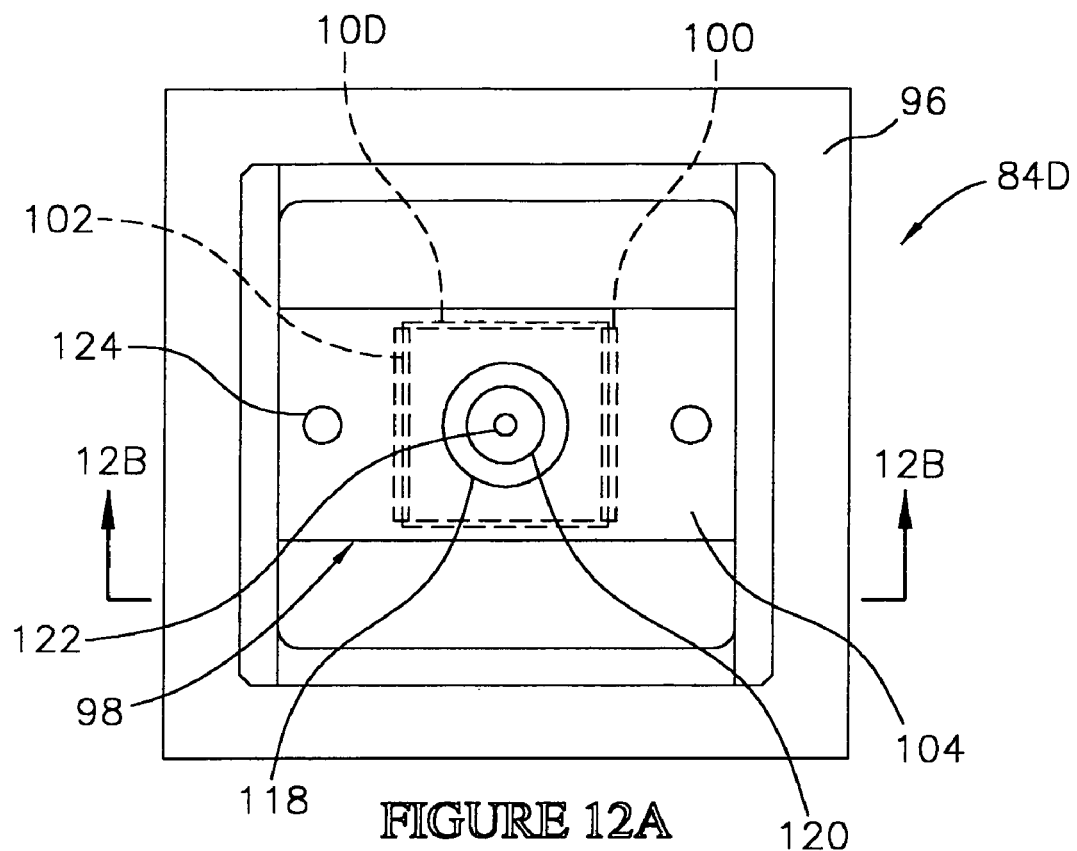
FIG. 12A is a plan view of a die level test system constructed in accordance with the invention.
Figure 12B:
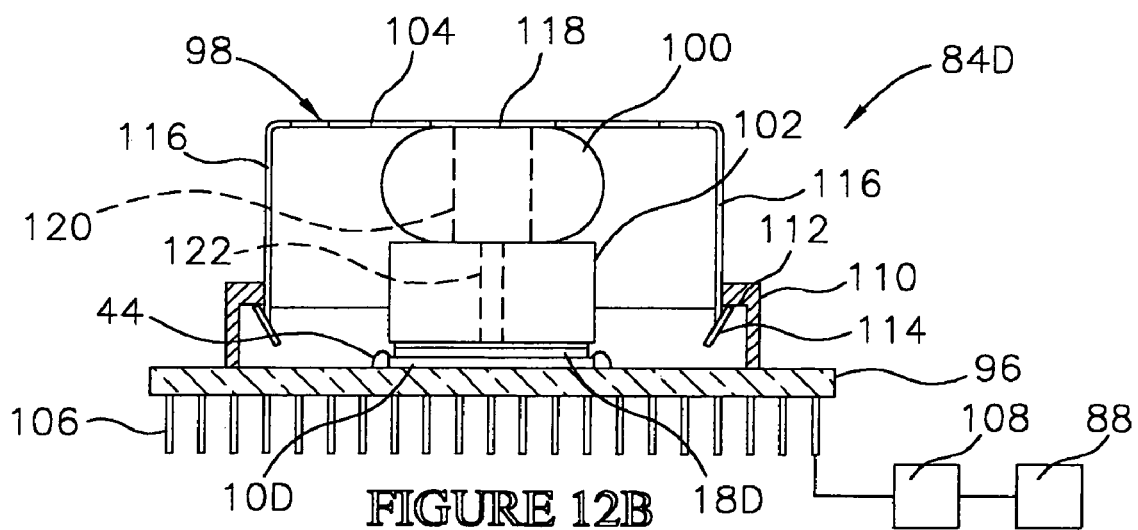
FIG. 12B is a cross sectional view taken along section line 12B—12B of FIG. 12A.

Referring to FIGS. 12A–12B, a die level test system 84D constructed with a die level interconnect 10D is illustrated. The test system 84D comprises a test carrier adapted to temporarily package a die-sized semiconductor component 18D, such as a bare die, or a chip scale package, for testing and burn-in.

The test system 84D includes a base 96, and the interconnect 10D mounted to the base 96. The test system 84D also includes a force applying mechanism 64 comprising a biasing member 100, a pressure plate 102, and a clamp 104. In addition, the base 96 includes a plurality of terminal leads 106 in electrical communication with the interconnect contacts 14 (FIG. 3), 14A (FIG. 4), 14B (FIG. 5A) or 14C (FIG. 6A) on the interconnect 10D.

The terminal leads 106 are adapted for electrical communication with a test apparatus 108 (FIG. 12B), such as a burn-in board, and test circuitry 88 (FIG. 12B). The test circuitry 88 generates test signals, and transmits the test signals to the terminal leads 106, and through the interconnect 10D to the component 18D. The test circuitry 88 also analyzes the resultant test signals transmitted from the component 18D. This arrangement permits various electrical characteristics of the component 18D to be evaluated.

In the illustrative embodiment, the terminal leads 106 comprise pins formed in a pin grid array (PGA) on a backside of the base 96. Alternately, other configurations for the terminal leads 106 can be provided. For example, the carrier base 96 can include ball contacts in a ball grid array (BGA) or fine ball grid array (FBGA).

The base 96 can comprise a laminated ceramic material fabricated using a ceramic lamination process with a desired geometry, and with metal features such as internal conductors and external pads. U.S. Pat. No. 5,519,332, entitled "Carrier For Testing An Unpackaged Semiconductor Die", which is incorporated herein by reference, describes a ceramic lamination process for fabricating the base 96. Alternately, rather than ceramic, the base 96 can comprise plastic, and the metal features formed using a 3-D molding process. Previously cited U.S. Pat. No. 5,519,332 describes a 3-D molding process for fabricating the base 96.

The base 96 includes internal conductors (not shown) in electrical communication with the terminal leads 106. In addition, the bond wires 44 are wire bonded to bond pads on the base 96 in electrical communication with the internal conductors in the base 96. The bond wires 44 are also wire bonded to the bonding pads 34 (FIG. 3) on the interconnect 10D, and establish electrical communication between the terminal leads 106 on the base 96, and the interconnect contacts 14 (FIG. 3), 14A (FIG. 4), 14B (FIG. 5A) or 14C (FIG. 6A) on the interconnect 10D.

The base 96 also includes a clamp ring 110 for attaching the clamp 104 of the force applying mechanism 98 to the base 96 during assembly of the test system 84D. The clamp ring 110 is attached to the base 96, and as shown in FIG. 12A, has a frame-like configuration. As also shown in FIG. 12B, the clamp ring 110 includes grooves 112 wherein the clamp 104 is attached. In the illustrative embodiment, the clamp ring 110 comprises metal, and is attached to the base 96 using a brazing process. One suitable metal for the clamp ring 110 comprises "KOVAR" coated with gold. The base 96 can include bonding features, such as metal pads, for attaching the clamp ring 110.

The clamp 104 comprises a flexible bridge-like structure formed of a resilient material such as steel. The clamp 104 includes tabs 114 that physically engage the grooves 112 on the clamp ring 110. In addition, the clamp 104 includes opposed sides 116 movable towards one another to permit engagement of the tabs 114 on the clamp 104, with the grooves 112 on the clamp ring 110. The clamp 104 also includes an opening 118 which provides access to the component 18D for a vacuum assembly tool during assembly of the test system 84D. The biasing member 100 also includes an opening 120, and the pressure plate 102 includes an opening 122 for the vacuum assembly tool. A pair of openings 124 (FIG. 12A) can also be provided on the clamp 104 for manipulation of the clamp 104 by the vacuum assembly tool during assembly of the test system 84D.

The pressure plate 102 can comprise a metal, a plastic, or a ceramic material. A peripheral shape and thickness of the pressure plate 102 can be selected as required.

Assembly of the test system 84D can be accomplished manually, or using an automated assembly apparatus. U.S. Pat. No. 5,796,264, entitled "Apparatus For Manufacturing Known Good Semiconductor Dice", which is incorporated herein by reference, describes a method and apparatus for assembling the carrier. In the illustrative embodiment, alignment of the component 18D with the interconnect 10D can be performed using an optical alignment technique. Such an optical alignment technique is described in the above cited U.S. Pat. No. 5,796,264. Alignment of the component 18D with the interconnect 10D can also be performed using a mechanical alignment fence.

Using the test system 84D the component 18D can be tested as required. In addition, the interconnect contacts 14 (FIG. 3), 14A (FIG. 4), 14B (FIG. 5A) or 14C (FIG. 6A) can move independently as previously described to accommodate variations in the size and planarity of the bumped contacts 16 on the component 18D.

Thus the invention provides an improved interconnect for testing semiconductor components having bumped contacts. The interconnect include contacts designed to provide a reliable electrical connection to the bumped contacts with a minimal application of contact force. In addition, the contacts are constructed to move independently in the z-direction to accommodate variations in the size and planarity of the bumped contacts.

While the invention has been described with reference to certain preferred embodiments, as will be apparent to those skilled in the art, certain changes and modifications can be made without departing from the scope of the invention as defined by the following claims.

What is claimed is:

1. An interconnect for testing a semiconductor component comprising:
   a substrate;
   a contact on the substrate configured to electrically engage a terminal contact on the component;
   a flexible segment on the substrate configured to permit the contact to flex during a test procedure, and to move independently of a second contact on the substrate; and
   a polymer material on the substrate configured to adjust a compliancy of the flexible segment.

2. The interconnect of claim 1 wherein the polymer material comprises a material selected from the group consisting of silicone, rubber, and elastomeric foam.

3. The interconnect of claim 1 further comprising a cavity in the substrate aligned with the contact and forming the flexible segment.

4. The interconnect of claim 1 wherein the contact comprises a projection configured to penetrate the terminal contact.

5. An interconnect for testing a semiconductor component having terminal contacts comprising:
   a substrate having a cavity;
   a contact on the substrate aligned with the cavity comprising a conductive layer configured to electrically engage a terminal contact on the component;
   a flexible segment of the substrate configured to move the contact independently of a second contact during a test procedure to accommodate variations in a size and planarity of the terminal contacts on the component; and
   a polymer material in the cavity.

6. The interconnect of claim 5 wherein the terminal contact comprises a bump and the contact further comprises a projection configured to penetrate the bump.

7. The interconnect of claim 5 wherein the flexible segment is between the contact and the cavity.

8. The interconnect of claim 5 wherein the polymer material comprises a material selected from the group consisting of silicone, rubber, and elastomeric foam.

9. An interconnect for testing a semiconductor component having a terminal contact comprising:
   a substrate having a first side, an opposing second side and a cavity on the second side;
   a flexible segment of the substrate formed by the cavity;
   a polymer material within the cavity; and
   a contact on the first side comprising a projection on the flexible segment, and a conductive layer on the projection configured to electrically engage the terminal contact on the component.

10. The interconnect of claim 9 wherein the terminal contact comprises a bump and the projection is configured to penetrate the bump.

11. The interconnect of claim 10 wherein the projection is configured to penetrate the terminal contact.

12. The interconnect of claim 9 wherein the polymer material comprises a material selected from the group consisting of silicone, rubber, and elastomeric foam.

* * * * *